US010357806B2

United States Patent
Kim et al.

(10) Patent No.: US 10,357,806 B2
(45) Date of Patent: Jul. 23, 2019

(54) SUBSTRATE TREATING APPARATUS AND METHOD

(71) Applicant: SEMES CO., LTD., Chungcheongnam-do (KR)

(72) Inventors: Jong Han Kim, Chungcheongnam-do (KR); Yoon-Jong Ju, Chungcheongnam-do (KR); Yu Hwan Kim, Chungcheongnam-do (KR); Edwin Lee, Chungcheongnam-do (KR); Seong Soo Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 79 days.

(21) Appl. No.: 14/747,287

(22) Filed: Jun. 23, 2015

(65) Prior Publication Data
US 2016/0001332 A1  Jan. 7, 2016

(30) Foreign Application Priority Data

Jul. 7, 2014  (KR) .................. 10-2014-0084394

(51) Int. Cl.
*B08B 3/02* (2006.01)
*H01L 21/67* (2006.01)
*B05B 17/00* (2006.01)
*B05B 13/02* (2006.01)

(52) U.S. Cl.
CPC ........... *B08B 3/02* (2013.01); *B05B 13/0242* (2013.01); *B05B 17/0646* (2013.01); *H01L 21/67051* (2013.01)

(58) Field of Classification Search
None
See application file for complete search history.

(56) References Cited

U.S. PATENT DOCUMENTS

| 2003/0005948 A1* | 1/2003 | Matsuno ............ B08B 3/04 134/33 |
| 2006/0150432 A1* | 7/2006 | Pham ............ H01L 21/67051 34/58 |
| 2009/0093123 A1* | 4/2009 | Lee ............ H01L 21/67051 438/706 |

(Continued)

FOREIGN PATENT DOCUMENTS

| CN | 101890431 A | 11/2010 |
| CN | 103021810 A | 4/2013 |

(Continued)

OTHER PUBLICATIONS

Office Action for corresponding Chinese Office Action No. 201510394284.1 dated Jun. 26, 2017.

*Primary Examiner* — Katelyn B Whatley
(74) *Attorney, Agent, or Firm* — Carter, DeLuca & Farrell LLP

(57) ABSTRACT

The inventive concepts provide an apparatus for treating a substrate. The apparatus includes a housing proving an inner space in which a substrate is treated, a spin head supporting and rotating the substrate in the housing, an injection unit comprising a first nozzle member spraying a first treatment solution to the substrate put on the spin head, and a controller controlling the first nozzle member. The first nozzle member includes a body, a vibrator, a pump, and a power source.

12 Claims, 4 Drawing Sheets

(56) References Cited

U.S. PATENT DOCUMENTS

| | | | |
|---|---|---|---|
| 2011/0031326 A1* | 2/2011 | Sato | H01L 21/02057 239/1 |
| 2012/0222707 A1* | 9/2012 | Sato | H01L 21/67051 134/33 |
| 2013/0052360 A1* | 2/2013 | Maegawa | B05B 17/0607 427/421.1 |

FOREIGN PATENT DOCUMENTS

| | | |
|---|---|---|
| JP | 2012-182320 A | 9/2012 |
| KR | 10-0793173 B1 | 1/2008 |
| KR | 2009-0125484 A | 12/2009 |
| KR | 2010-0103377 A | 9/2010 |
| KR | 2010-0123884 A | 11/2010 |
| KR | 2012-0092974 A | 8/2012 |
| KR | 20140058190 A * | 5/2014 |

* cited by examiner

SUBSTRATE TREATING APPARATUS AND METHOD

CROSS-REFERENCE TO RELATED APPLICATION

This U.S. non-provisional patent application claims priority under 35 U.S.C. § 119 to Korean Patent Application No. 10-2014-0084394, filed on Jul. 7, 2014, in the Korean Intellectual Property Office, the disclosure of which is hereby incorporated by reference in its entirety.

BACKGROUND

The inventive concepts relate to a substrate treating apparatus and a method for treating a substrate using the same.

Various processes (e.g., photolithography, etching, ashing, ion implantation and deposition processes) are performed to manufacture a semiconductor device or a liquid crystal display device. A cleaning process is performed before or after each of the processes to remove byproducts and/or particles generated in each of the processes.

To remove the byproducts and/or the particles remaining on a substrate, the cleaning process may be performed by jetting a chemical, a treatment solution mixed with gas, or a treatment solution provided with vibration.

The method of spraying the treatment solution using the vibration may have an advantage capable of variously adjusting a particle size of the treatment solution. The treatment solution having the adjusted particle size may weaken adhesive force of the byproducts and/or the particles remaining on the substrate or may remove the byproducts and/or the particles. However, if liquid drops of the treatment solution have abnormal sizes, patterns of a substrate may be damaged.

SUMMARY

Embodiments of the inventive concepts may provide a substrate treating apparatus capable of improving cleaning efficiency.

In one aspect, a substrate treating apparatus may include a housing proving an inner space in which a substrate is treated, a spin head supporting and rotating the substrate in the housing, an injection unit comprising a first nozzle member spraying a first treatment solution to the substrate put on the spin head, and a controller controlling the first nozzle member. The first nozzle member may include a body comprising: an injection fluid path in which the first treatment solution flows; and a first discharge opening connected to the injection fluid path to spray the first treatment solution; a vibrator installed within the body, the vibrator providing vibration to the first treatment solution flowing in the injection fluid path; a pump pressurizing the first treatment solution into the body to supply the first treatment solution; and a power source connected to the vibrator to operate the vibrator. When the first treatment solution is sprayed by the first nozzle member, the controller may operate the pump to supply the first treatment solution after controlling the power source for operating the vibrator.

In an embodiment, if the supply of the first treatment solution is completed, the controller may interrupt the pump to remove pressure caused in the first nozzle member by the first treatment solution and then may turn off the power source.

In an embodiment, the injection unit may further include a second nozzle member spraying a second treatment solution onto the substrate.

In an embodiment, the injection fluid path may include a first region and a second region that have ring shapes when viewed from a plan view, and a radius of the first region may be greater than that of the second region.

In an embodiment, the first discharge opening may include a plurality of first discharge openings disposed in each of the first and second regions. When viewed from a plan view, the first discharge openings of the first region may be arranged in a line along the first region and the first discharge openings of the second region may be arranged in two lines along the second region when viewed from a plan view.

In an embodiment, the first treatment solution may include a cleaning solution, and the second treatment solution may include ammonia and hydrogen peroxide.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
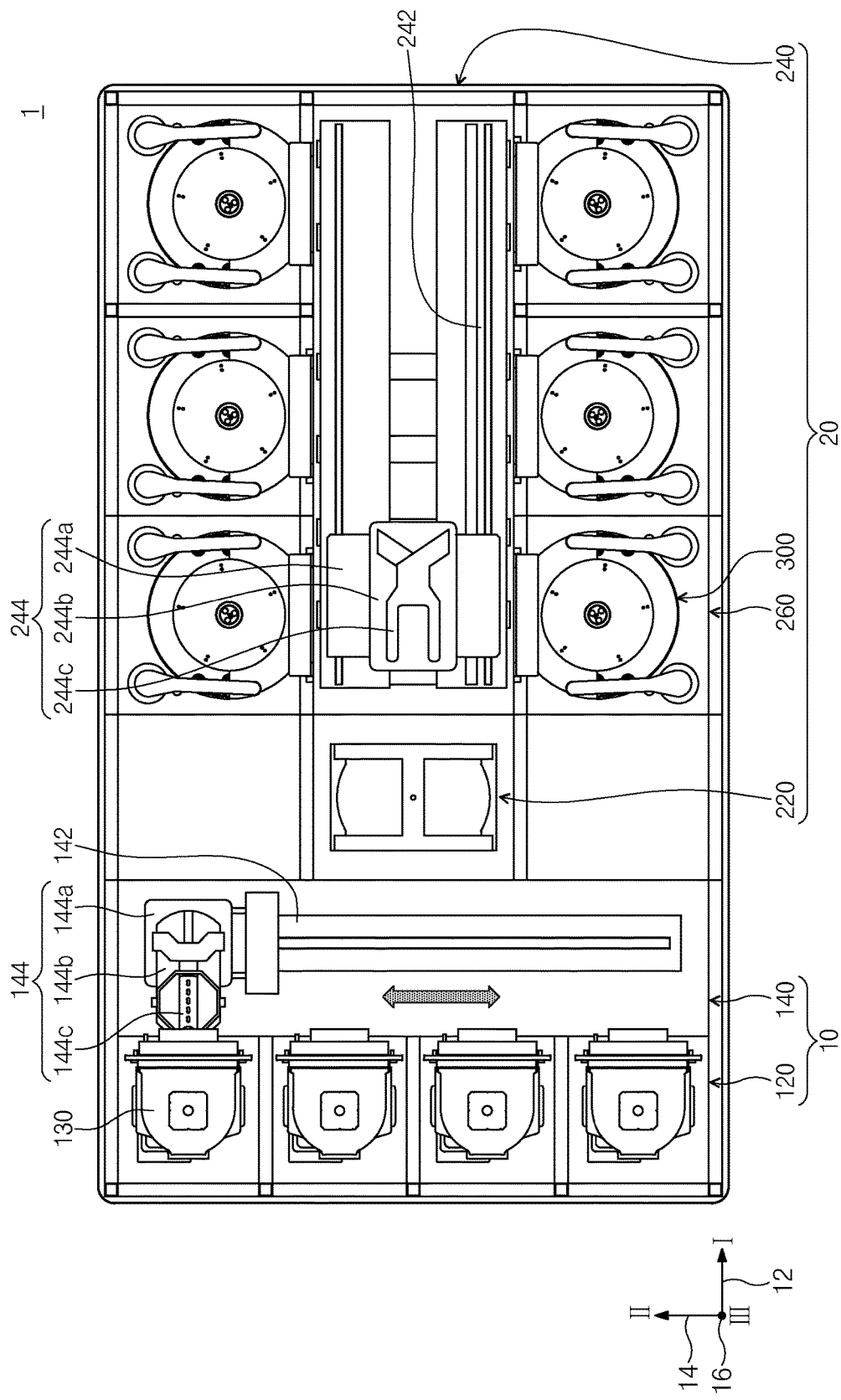
FIG. 1 is a plan view illustrating substrate-treating equipment according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, example embodiments of the inventive concepts will be described in detail with reference to FIGS. 1 to 6.

FIG. 1 is a plan view illustrating substrate-treating equipment according to example embodiments of the inventive concepts. Referring to FIG. 1, substrate-treating equipment 1 may include an index module 10 and a process treating module 20. The index module 10 may include a load port 120 and a transfer frame 140. The load port 120, the transfer frame 140, and the process treating module 20 may be sequentially arranged in a line. Hereinafter, a direction in which the load port 120, the transfer frame 140, and the process treating module 200 are arranged may be defined as a first direction 12, a direction perpendicular to the first direction 12 when viewed from a plan view may be defined as a second direction 14, and a direction perpendicular to a plane defined by the first and second directions 12 and 14 may be defined as a third direction 16.

A carrier 130 in which a substrate W is received may be safely put on the load port 120. The load port 120 may be provided in plurality, and the plurality of load ports may be arranged in a line along the second direction 14. The number of the load ports 120 may increase or decrease according to process efficiency and a footprint condition of the process treating module 20. A plurality of slots (not shown) for receiving the substrates W may be formed in the carrier 130 in such a way that the substrates W received in the slots are disposed horizontally to the ground. A front opening unified pod (FOUP) may be used as the carrier 130.

The process treating module 20 may include a buffer unit 220, a transfer chamber 240, and process chambers 260. The transfer chamber 240 may be disposed such that its longitudinal direction is parallel with the first direction 12. The process chambers 260 may be arranged at both sides of the transfer chamber 240. The process chambers 260 respectively disposed at one side and the other side of the transfer chamber 240 may be symmetrical with respect to the transfer chamber 240. A plurality of process chambers 260 may be provided at each side of the transfer chamber 240. Some of the process chambers 260 may be arranged along the longitudinal direction of the transfer chamber 240. In addition, some of the process chambers 260 may be sequentially stacked. In other words, the process chambers 260 may be arranged in an A-by-B matrix at each side of the transfer chamber 240. Here, "A" denotes the number of process chambers 260 arranged in a line along the first direction 12, and "B" denotes the number of process chambers 260 arranged in a line along the third direction 16. When four or six process chambers 260 are provided at each side of the transfer chamber 240, the process chambers 260 may be arranged in a 2-by-2 or 3-by-2 matrix. The number of process chambers 260 may increase or decrease. In other embodiments, the process chambers 260 may be provided only at one side of the transfer chamber 240. In still other embodiments, the process chambers 260 may be arranged in a single layer at one side or both sides of the transfer chamber 240.

The buffer unit 220 may be disposed between the transfer frame 140 and the transfer chamber 240. The buffer unit 220 may provide a space in which a substrate W stays before transferred between the transfer chamber 240 and the transfer frame 140. A slot (not shown) where a substrate W is placed may be provided in the buffer unit 220. The slot may be provided in plurality in the buffer unit 220, and the slots of the buffer unit 220 may be spaced apart from each other along the third direction 16. The buffer unit 220 may have an opened side facing the transfer frame 140 and an opened side facing the transfer chamber 240.

The transfer frame 140 may transfer the substrate W between the buffer unit 220 and the carrier 130 put safely on the load port 120. An index rail 142 and an index robot 144 may be provided in the transfer frame 140. The index rail 142 may be provided such that its longitudinal direction is parallel to the second direction 14. The index robot 144 may be installed on the index rail 142 and may be linearly movable in the second direction 14 along the index rail 142. The index robot 144 may include a base 144a, a body 144b, and an index arm 144c. The base 144a may be installed to be movable along the index rail 142. The body 144b may be joined to the base 144a. The body 144b may be provided to be movable on the base 144a along the third direction 16. In addition, the body 144b may be provided to be rotatable on the base 144a. The index arm 144c may be joined to the body 144b such that it is forward and backward movable with respect to the body 144b. The index arm 144c may be provided in plurality, and the plurality of index arms 144c may be driven independently of each other. The index arms 144c may be sequentially stacked and be spaced apart from each other in the third direction 16. At least one of the index arms 144c may be used to transfer a substrate W from the process treating module 20 to the carrier 130, and at least another of the index arms 144c may be used to transfer the substrate W from the carrier 130 to the process treating module 20, thereby preventing particles, generated from the substrate W not experiencing a treating process when the substrate W is carried into or taken out of by the index robot 114, from being attached to the substrate W.

The transfer chamber 240 may transfer the substrate W between the buffer unit 220 and the process chamber 260 and between the process chambers 260. A guide rail 242 and a main robot 244 may be provided in the transfer chamber 240. The guide rail 242 may be disposed such that its longitudinal direction is parallel to the first direction 12. The main robot 244 may be installed on the guide rail 242 and may be linearly moveable in the first direction 12 on the guide rail 242. The main robot 244 may include a base 244a, a body 244b, and a main arm 244c. The base 244a may be installed to be movable along the guide rail 242. The body 244b may be joined to the base 244a. The body 244b may be provided to be movable on the base 244a along the third direction 16. In addition, the body 244b may be provided to be rotatable on the base 244a. The main arm 244c may be joined to the body 244b such that it is forward and backward movable with respect to the body 244b. The main arm 244c may be provided in plurality, and the plurality of main arms 244c may be driven independently of each other. The main arms 244c may be sequentially stacked and be spaced apart from each other in the third direction 16.

A substrate treating apparatus 300 for cleaning a substrate W may be provided in each of the process chambers 260. The substrate treating apparatuses 300 may have different structures according to kinds of cleaning processes. Alternatively, the substrate treating apparatuses 300 of the process chambers 260 may have the same structure. Optionally, the process chambers 260 may be divided into a plurality of groups. In this case, the substrate treating apparatuses 300 in the same group may have the same structure, and the substrate treating apparatuses 300 respectively included in different groups may have different structures from each other.

Figure 2:
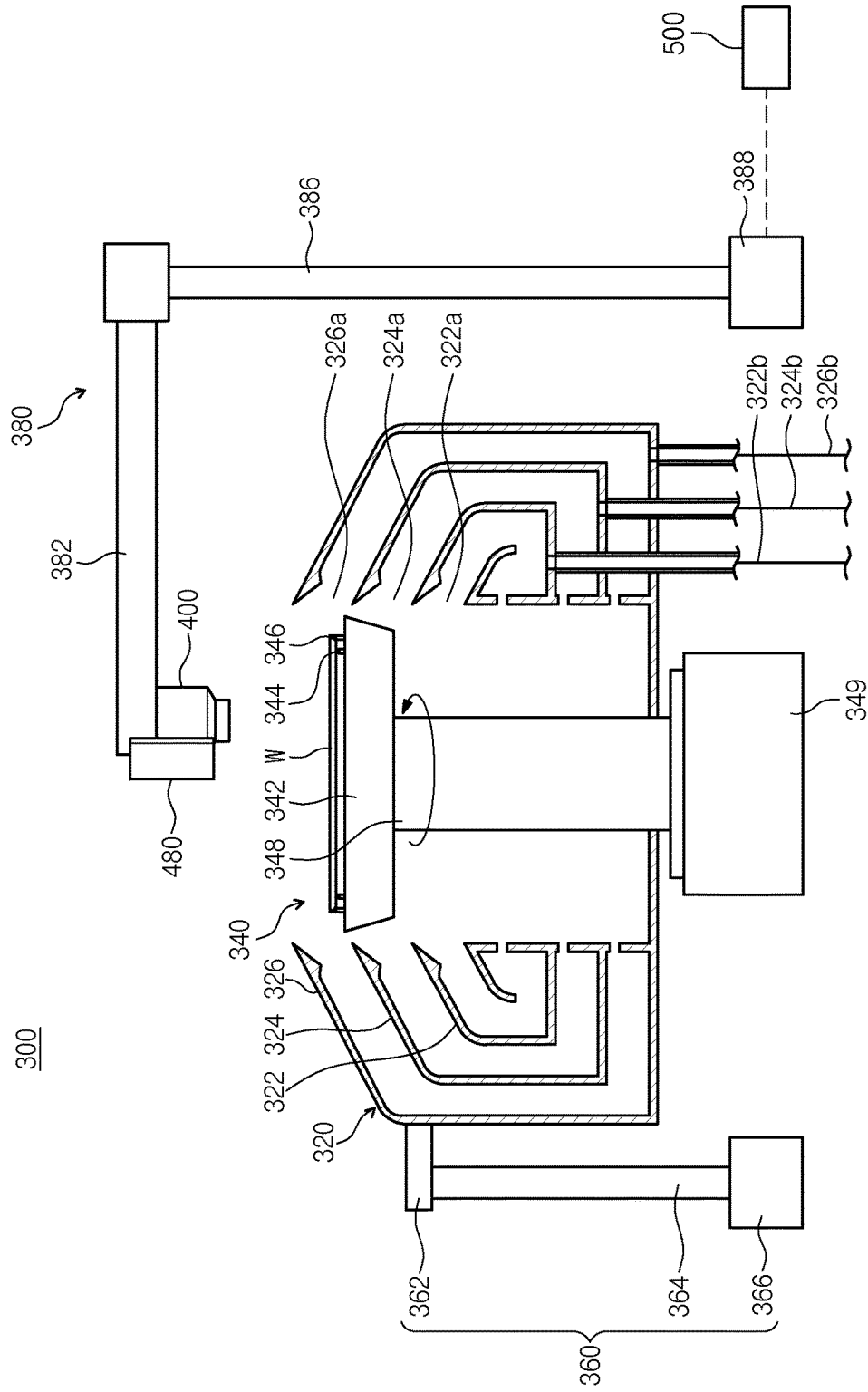
FIG. 2 is a cross-sectional view illustrating a substrate treating apparatus of FIG. 1 according to example embodiments of the inventive concepts.

FIG. 2 is a cross-sectional view illustrating a substrate treating apparatus of FIG. 1 according to example embodiments of the inventive concepts. Referring to FIG. 2, the substrate treating apparatus 300 may include a housing 320, a spin head 340, an elevating unit 360, and an injection unit 380. The housing 320 may have a space in which a substrate treating process is performed, and a top end of the housing 320 may be opened. The housing 320 may include an inner collecting vessel 322, an intermediate collecting vessel 324, and an outer collecting vessel 326. The collecting vessels 322, 324, and 326 may respectively collect different treatment solutions used in the process. The inner collecting vessel 322 may have a ring shape surrounding the spin head 340, the intermediate collecting vessel 324 may have a ring shape surrounding the inner collecting vessel 322, and the outer collecting vessel 326 may have a ring shape surrounding the intermediate collecting vessel 324. An inside space 322a of the inner collecting vessel 322, a space 324a between the inner and intermediate collecting vessels 322 and 324, and a space 326a between the intermediate and outer collecting vessels 324 and 326 may function as inlets of the collecting vessels 322, 324, and 326 into which the treatment solutions flow. Collecting lines 322b, 324b, and 326b may be connected to bottom surfaces of the collecting vessels 322, 324, and 326, respectively. The collecting lines 322b, 324b, and 326b may extend downward from the bottom surfaces of the collecting vessels 322, 324, and 326, respectively. The treatment solutions provided through the collecting vessels 322, 324, and 326 may be exhausted through the collecting lines 322b, 324b, and 326b. The exhausted treatment solutions may be reused through an external treatment solution regenerating system (not shown).

The spin head 340 may support and rotate the substrate W during the process. The spin head 340 may include a body 342, a support pin 344, a chuck pin 346, and a support shaft 348. The body 342 may have a substantially circular top surface when viewed from a plan view. The support shaft 348 may be rotatable by a motor 349 and may be fixedly connected to a bottom surface of the body 342.

The support pin 344 may be provided in plurality. The support pins 344 may be arranged on an edge portion of the top surface of the body 342 by predetermined distances and may protrude upward from the top surface of the body 342. The support pins 344 may be arranged in a ring-shaped form. The support pins 344 may support an edge portion of a bottom surface of the substrate W such that the substrate W may be spaced apart from the top surface of the body 342 by a predetermined distance.

The chuck pin 346 may be provided in plurality. The chuck pin 346 may be disposed such that it is further from the center of the body 342 than the support pin 344 is. The chuck pin 346 may protrude from the top surface of the body 342. When the spin head 340 is rotated, the chuck pin 346 may support a sidewall of the substrate W to prevent the substrate W from deviating from a given position to a lateral direction. The chuck pin 346 may be linearly moveable between a waiting position and a support position along a radius direction of the body 342. A distance between the waiting position and the center of the body 342 may be greater than a distance between the support position and the center of the body 342. When the substrate W is loaded on or unloaded from the spin head 340, the chuck pin 346 may be placed at the waiting position. When the substrate treating process is performed, the chuck pin 346 may be placed at the support position. The chuck pin 346 may become in contact with the sidewall of the substrate W at the support position.

The housing 320 may be linearly movable by the elevating unit 360 in an up-and-down direction. The housing 320 may be moved in the up-and-down direction to change a relative height of the housing 320 with respect to the spin head 340. The elevating unit 360 may include a bracket 362, a movement shaft 364, and a driving unit 366. The bracket 362 may be fixedly installed on an outer sidewall of the housing 320, and the movement shaft 364 may be fixedly installed on the bracket 362. The movement shaft 364 may be movable by the driving unit 366 in the up-and-down direction. When the substrate W is put on the spin head 340 or is lifted from the spin head 340, the housing 320 may descend such that the spin head 340 may protrude upward from the housing 320. Also, the height of the housing 320 may be adjusted in the process such that the treatment solution supplied to the substrate W is provided into a corresponding collecting vessel 322, 324, or 326 predetermined according to the kind of the treatment solution. In other embodiments, the elevating unit 360 may move the spin head 340 in the up-and-down direction.

The injection unit 380 may provide the treatment solution onto the substrate W. The injection unit 380 may provide various kinds of the treatment solutions. Alternatively, the injection unit 380 may be provided in plurality to provide the same kind of the treatment solution in various methods. The injection unit 380 may include a support shaft 386, a nozzle arm 382, a first nozzle member 400, a cleaning member (not shown), and a second nozzle member 480. The support shaft 386 may have a rod shape of which a longitudinal direction is parallel to the up-and-down direction. The support shaft 386 may be swung and vertically moved by a driving member 388. Alternatively, the support shaft 386 may be horizontally moved in a straight line and vertically moved by the driving member 388. The nozzle arm 382 may be fixedly joined to a top end of the support shaft 386. The nozzle arm 382 may support the first and second nozzle members 400 and 480. The first and second nozzle members 400 and 480 may be located at an end of the nozzle arm 382. For example, the second nozzle member 480 may be closer to the end of the nozzle arm 382 than the first nozzle member 400 may be. The cleaning member may clean the first nozzle member 400. The cleaning member may be provided in the housing 320. A controller 500 may place the first nozzle member 400 at a discharging position over the substrate W when the first nozzle member 400 discharges a first treatment solution onto the substrate W. On the other hand, the controller 500 may place the first nozzle member 400 at a cleaning position within a solution bath (not shown) after the discharge of the first treatment solution is completed.

Figure 3:
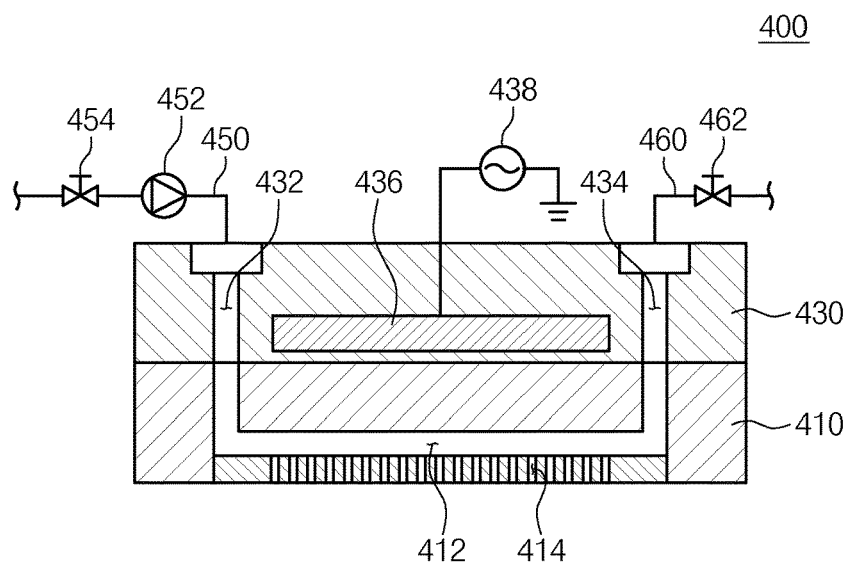
FIG. 3 is a cross-sectional view illustrating a first nozzle member of FIG. 2.
Figure 4:
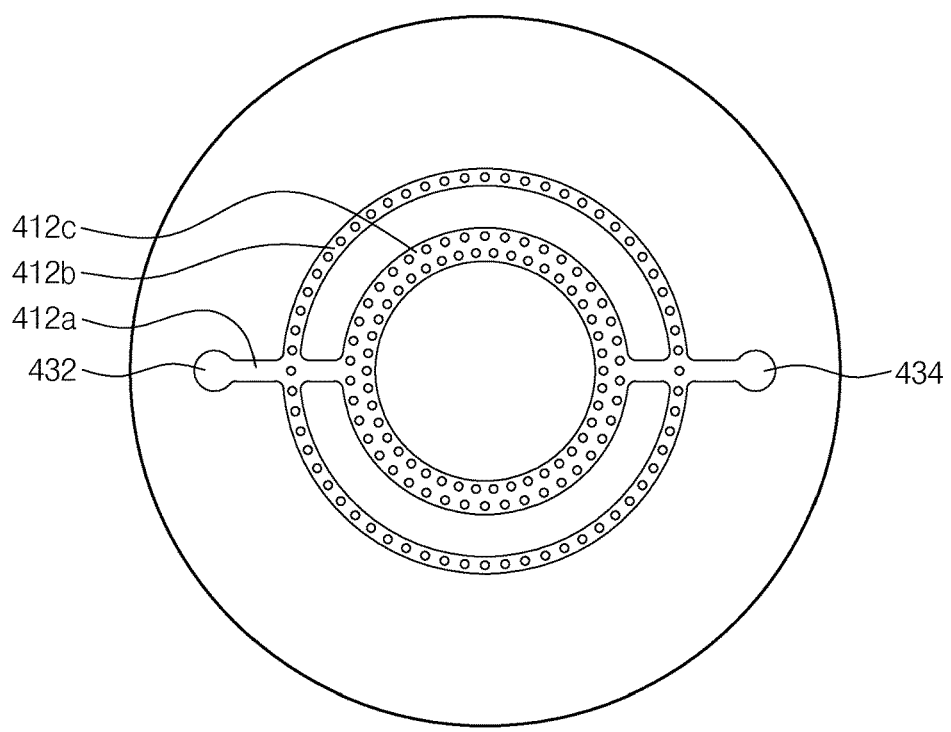
FIG. 4 is a bottom view illustrating the first nozzle member of FIG. 3.

FIG. 3 is a cross-sectional view illustrating the first nozzle member 400 of FIG. 2. FIG. 4 is a bottom view illustrating the first nozzle member 400 of FIG. 3. The first nozzle member 400 may have a circular shape when viewed from a plan view. Referring to FIGS. 2, 3, and 4, the first nozzle member 400 may spray the first treatment solution by an inkjet method. The first nozzle member 400 may include a body 410 and 430, a vibrator 436, a treatment solution supply line 450, and a treatment solution collecting line 460. The first nozzle member 400 may be controlled by the controller 500. The body 410 and 430 may have a bottom plate 410 and a top plate 430. The bottom plate 410 may have a cylindrical shape. An injection fluid path 412 through which the first treatment solution flows may be formed in the bottom plate 410. The injection fluid path 412 may connect an inflow fluid path 432 to a collection fluid path 434. A plurality of first discharge openings 414 spraying the first treatment solution may be formed in a bottom surface of the bottom plate 410. Each of the first discharge openings 414 may be connected to the injection fluid path 412. The first discharge openings 414 may be fine holes. The injection fluid path 412 may include a first region 412b, a second region 412c, and a third region 412a. The first region 412b and the second region 412c may have ring shapes when viewed from a plan view. Here, a radius of the first region 412b may be greater than that of the second region 412c. The first discharge openings 414 of the first region 412b may be arranged in a line along the first region 412b. The first discharge openings 414 of the second region 412c may be arranged in two lines along the second region 412c. The third region 412a may connect the first and second regions 412b and 412c to the inflow fluid path 432. In addition, the third region 412a may connect the first and second regions 412b and 412c to the collection fluid path 434. For example, the third region 412a may extend from the inflow fluid path 432 or the collection fluid path 434 to the second region 412c through the first region 412b, as illustrated in FIG. 4. The top plate 430 may have a cylindrical shape of which a diameter is equal to that of the bottom plate 410. The top plate 430 may be fixedly combined with a top surface of the bottom plate 410. The inflow fluid path 432 and the collection fluid path 434 are formed within the top plate 430. The inflow fluid path 432 and the collection fluid path 434 may be connected to the second region 412c of the injection fluid path 412 by the third region 412a. The inflow fluid path 432 may function as an inlet in which the first treatment solution flows, and the collection fluid path 434 may function as an outlet from which the first treatment solution is collected. The inflow fluid path 432 and the collection fluid path 434 may be disposed to face each other with a center of the first nozzle member 400 interposed therebetween.

The vibrator 436 may be disposed within the top plate 430. The vibrator 436 may have a circular plate shape when viewed from a plan view. For example, the vibrator 436 may have the same diameter as the first region 412b. Alternatively, the diameter of the vibrator 436 may be greater than that of the first region 412b and smaller than that of the top plate 430. The vibrator 436 may be electrically connected to a power source 438 disposed outside of the first nozzle member 400. The vibrator 436 may provide vibration to the sprayed first treatment solution to control particle sizes and a speed of the first treatment solution. In some embodiments, the vibrator 436 may be a piezoelectric device. The first treatment solution may be a cleaning solution. For example, the first treatment solution may include electrolytically ionized water. The first treatment solution may include at least one of hydrogen water, oxygen water, or ozone water. In other embodiments, the first treatment solution may be pure water (e.g., deionized water).

The treatment solution supply line 450 may supply the first treatment solution into the inflow fluid path 432, and the treatment solution collecting line 460 may collect the first treatment solution from the collection fluid path 434. The treatment solution supply line 450 may be connected to the inflow fluid path 432, and the treatment solution collecting line 460 may be connected to the collection fluid path 434. A pump 452 and a supply valve 454 may be installed on the treatment solution supply line 450. A collecting valve 462 may be installed on the treatment solution collecting line 460. The pump 452 may apply pressure to the first treatment solution supplied from the treatment solution supply line 450 to the inflow fluid path 432. The pump 452 may be operated to supply the first treatment solution into the body 410 and 430. The supply valve 454 may open and close the treatment solution supply line 450. The collecting valve 462 may open and close the treatment solution collecting line 460. In some embodiments, the collecting value 462 may open the treatment solution collecting line 460 in a waiting state of the process, and thus, the first treatment solution may be collected through the treatment solution collecting line 460 but may not be discharged through the first discharge openings 414. On the other hand, the collecting valve 462 may close the treatment solution collecting line 460 during the process. Thus, the injection fluid path 412 may be filled with the first treatment solution to increase internal pressure of the injection fluid path 412, and the first treatment solution may be sprayed through the first discharge openings 414 when a voltage is applied to the vibrator 436.

Figure 5:
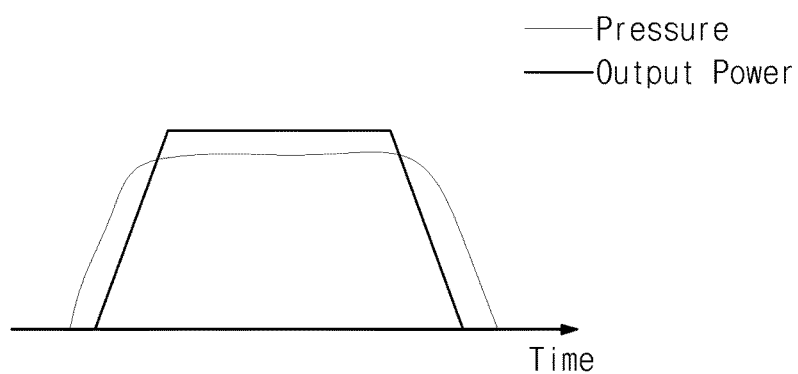
FIG. 5 is a graph illustrating conventional pressure and output power.
Figure 6:
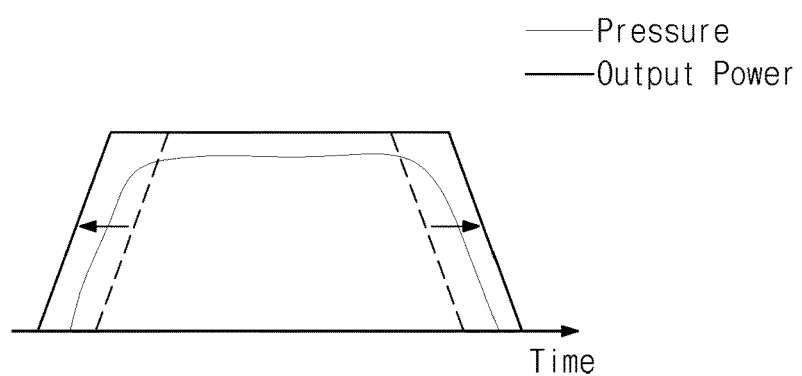
FIG. 6 is a graph illustrating pressure and output power according to example embodiments of the inventive concepts.

FIG. 5 is a graph illustrating conventional pressure and output power. FIG. 6 is a graph illustrating pressure and output power according to example embodiments of the inventive concepts. Hereinafter, a process of controlling the first nozzle member 400 by the controller 500 will be described with reference to FIGS. 5 and 6. The controller 500 controls the first nozzle member 400. The first nozzle member 400 may discharge the first treatment solution by the inject method. At this time, liquid drops of the first treatment solution are affected by output power generated by the vibration of the vibrator 436 and pressure, influencing the body 410 and 430, of the first treatment solution. For example, the controller 500 may control operations and an operating order of the pump 452 and the power source 438. For example, when the first treatment solution is supplied to the first nozzle member 400, the controller 500 may operate the power source 438 to normally work the vibrator 436 and then may operate the pump to supply the first treatment solution. If the supply of the first treatment solution is completed, the controller 500 may interrupt the pump 452 to remove the pressure of the first nozzle member 400 by the first treatment solution and then may interrupt the power source 438.

In a conventional method of supplying the first treatment solution by the first nozzle member 400, the power source 438 of the vibrator 436 may be opened after the first treatment solution is supplied by the pump 452. Thus, as illustrated in FIG. 5, the pressure caused by the first treatment solution may be applied prior to the applying of the output power of the vibrator 436, and the output power of the vibrator 436 may become extinct prior to the pressure caused by the first treatment solution. In other word, the first treatment solution may be discharged by the pump 452 before the vibrator 436 is vibrated. If the first treatment solution is discharged before the vibration of the vibrator 436, its liquid drops may be abnormally discharged. For example, large-sized liquid drops may be discharged or a plurality of liquid drops may be discharged at the same time. In addition, if the pump 452 is interrupted after the interruption of the power source 438 of the vibrator 436, the abnormal liquid drops may also be discharged. Energy of the liquid drops may increase as the sizes of the liquid drops increases. Thus, patterns of the substrate may be damaged by the liquid drops provided onto the substrate. However, according to an embodiment of the inventive concepts, the controller 500 may control the power source 438 such that the vibrator 436 is operated prior to the operation of the pump 452 when the first treatment solution is supplied to the nozzle member 400. After the vibrator 436 is operated, the controller 500 may control the pump 452 such that the first treatment solution is provided into the body 410 and 430. After the supply of the first treatment solution is completed, the controller 500 may interrupt the pump 452 to discontinue the supply of the first treatment solution. Thus, the pressure of the first treatment solution may be removed. Thereafter, the controller 500 may interrupt the power source 438. As a result, it is possible to minimize the damage of the substrate W caused by the liquid drops.

Referring again to FIG. 2, the second nozzle member 480 may supply a second treatment solution onto the substrate W. The second nozzle member 480 may supply the second treatment solution when the first nozzle member 400 supplies the first treatment solution. At this time, the second nozzle member 480 may supply the second treatment solution before the supply of the first treatment solution is started by the first nozzle member 480. For example, the second treatment solution may be sprayed by a dropping method. The second nozzle member 480 may surround a portion of the first nozzle member 400. The second nozzle member 480 may be more adjacent to one end of the nozzle arm 382 than the first nozzle member 400 may be. The second nozzle member 480 may have a second discharge opening (not shown) that vertically discharges the second treatment solution to the top surface of the substrate W. The second nozzle member 480 may have an arc shape surrounding the first nozzle member 400 when viewed from a plan view. A straight distance from one end to another end of the second nozzle member 480 may be greater than a diameter of the first nozzle member 400. At this time, the first nozzle member 400 may be concentric with the second nozzle member 480. The second treatment solution may be a protection solution. For example, the second treatment solution may include ammonia and hydrogen peroxide. The second treatment solution may form a liquid layer on the substrate W, and the liquid layer may relieve an impulse of the first treatment solution which affects the substrate W. Thus, it is possible to prevent the patterns of the substrate W from leaning by the first treatment solution. In other embodiments, the second treatment solution may be pure water (e.g., deionized water). The second discharge opening (not shown) may have a single slot shape. Alternatively, the second discharge opening may include a plurality of circular discharge holes. The second nozzle member 480 may provide the second treatment solution to a first region of the substrate W which is adjacent to a second region to which the first treatment solution is provided. The first region may be closer to a central region of the substrate W than the second region may be. In other embodiments, the second nozzle member 480 may have a bar shape, not the air shape.

The substrate treating apparatus described above may be used in various processes as well as the substrate cleaning process. For example, the substrate treating apparatus may be used in an etching process. In addition, the substrate treating apparatus may further include an additional rinse solution member. In the substrate treating apparatus described above, the second nozzle member has the shape surrounding the portion of the first nozzle member. However, the inventive concepts are not limited thereto. In other embodiments, the second nozzle member may have another shape.

According to the above embodiments of the inventive concepts, it is possible to improve cleaning efficiency of the substrate treating apparatus.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A substrate treating apparatus comprising:
   a housing providing an inner space in which a substrate is treated;
   a spin head supporting and rotating the substrate in the housing;
   an injection unit comprising a first nozzle member spraying a first treatment solution to the substrate put on the spin head; and
   a controller controlling the first nozzle member to supply the first treatment solution and discontinue supply of the first treatment solution,
   wherein the first nozzle member comprises:
      a body comprising:
         an injection fluid path in which the first treatment solution flows; and first discharge openings connected to the injection fluid path to spray the first treatment solution;
a vibrator installed within the body, the vibrator providing vibration to the first treatment solution flowing in the injection fluid path;
a pump pressurizing the first treatment solution into the body to supply the first treatment solution; and
a power source connected to the vibrator to operate the vibrator,
wherein the controller is configured to delay activating the pump to supply the first treatment solution until after the vibrator is activated by the power source,
wherein the controller is configured to delay turning off the power source to the vibrator until after the supply of the first treatment solution is discontinued,
wherein the injection fluid path includes a first circular path, a second circular path inside of and concentric with the first circular path, and a third linear path intersecting the first and second circular paths to connect the first and second circular paths to an inflow path of the first treatment solution, and
wherein the first discharge openings are located along the first and second circular paths and are not located over portions of the third linear path, in which the third linear path does not intersect with the first and second circular paths.

2. The substrate treating apparatus of claim 1, wherein, if the supply of the first treatment solution is completed, the controller interrupts the pump to remove pressure caused in the first nozzle member by the first treatment solution and then turns off the power source.

3. The substrate treating apparatus of claim 1, wherein the housing includes:
an inner collecting vessel surrounding the spin head, the inner collecting vessel defining a first space therein; and
an intermediate collecting vessel surrounding the inner collecting vessel, a second space being defined between the inner and intermediate collecting vessels.

4. The substrate treating apparatus of claim 3, further comprising:
a first collecting line connected to a bottom surface of the inner collecting vessel and in fluid communication with the first space; and
a second collecting line connected to a bottom surface of the intermediate collecting vessel and in fluid communication with the second space.

5. The substrate treating apparatus of claim 3, wherein the housing is movable relative to the spin head to selectively adjust a position of the inner and intermediate collecting vessels relative to the substrate.

6. The substrate treating apparatus of claim 1, wherein the vibrator is disposed within a top plate of the body.

7. The substrate treating apparatus of claim 1, wherein the vibrator has a circular shape and the same diameter or a larger diameter than the first circular path of the injection fluid path.

8. The substrate treating apparatus of claim 1, wherein the first circular path includes a plurality of first discharge openings and the second circular path includes a plurality of first discharge openings,
wherein the first discharge openings of the first circular path are arranged in a line along the first circular path when viewed from a plan view, and
wherein the first discharge openings of the second circular path are arranged in two lines along the second circular path when viewed from a plan view.

9. The substrate treating apparatus of claim 1, wherein the third, linear path of the injection fluid path includes:
a first linear section disposed on a first side of a central longitudinal axis defined by the first nozzle member, the first linear section interconnecting a first section of the first and second circular paths and extending diametrically through the first and second circular paths; and
a second linear section disposed on a second side of the central longitudinal axis, the second linear section interconnecting a second section of the first and second circular paths and being aligned with the first linear section, the first and second sections of the first and second circular paths being disposed on opposite sides of the central longitudinal axis.

10. A method for treating a substrate using the substrate treating apparatus of claim 1, the method comprising:
controlling the power source to operate the vibrator;
operating the pump to supply the first treatment solution into the body after operating the vibrator;
discontinuing supply of the first treatment solution after completion of supply of the first treatment solution; and
turning off the power source after interrupting the pump for removing pressure caused in the first nozzle member by the first treatment solution after the supply of the first treatment solution is discontinued.

11. The method of claim 10, wherein the first nozzle member sprays the first treatment solution by spraying drops of the first treatment solution.

12. The method of claim 10, wherein operating the pump to supply the first treatment solution into the body after operating the vibrator includes the treatment solution flowing through the injection fluid path of the body of the nozzle member.

* * * * *